(12) United States Patent
Letertre

(10) Patent No.: US 8,487,295 B2
(45) Date of Patent: Jul. 16, 2013

(54) SEMICONDUCTOR STRUCTURES AND DEVICES INCLUDING SEMICONDUCTOR MATERIAL ON A NON-GLASSY BONDING LAYER

(75) Inventor: Fabrice Letertre, Grenoble (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/343,512

(22) Filed: Jan. 4, 2012

(65) Prior Publication Data

US 2012/0112205 A1 May 10, 2012

Related U.S. Application Data

(62) Division of application No. 12/890,220, filed on Sep. 24, 2010, now Pat. No. 8,114,754.

(60) Provisional application No. 61/262,391, filed on Nov. 18, 2009, provisional application No. 61/286,680, filed on Dec. 15, 2009.

(51) Int. Cl.
*H01L 29/06* (2006.01)

(52) U.S. Cl.
USPC .......... 257/13; 257/12; 257/15; 257/18; 257/77; 257/94; 438/22; 438/46

(58) Field of Classification Search
None
See application file for complete search history.

(56) References Cited

U.S. PATENT DOCUMENTS

| | | | |
|---|---|---|---|
| 5,635,093 A | 6/1997 | Arena et al. | |
| 5,972,790 A | 10/1999 | Arena et al. | |
| 6,090,705 A | 7/2000 | Arena et al. | |
| 6,121,112 A | 9/2000 | Sakaguchi | |
| 6,121,140 A | 9/2000 | Arena et al. | |
| 6,303,468 B1 | 10/2001 | Aspar | |
| 6,316,333 B1 | 11/2001 | Bruel | |
| 6,335,258 B1 | 1/2002 | Aspar et al. | |

(Continued)

FOREIGN PATENT DOCUMENTS

| WO | 9307550 A1 | 4/1993 |
|---|---|---|
| WO | 9533866 A1 | 12/1995 |

(Continued)

OTHER PUBLICATIONS

Arena, U.S. Appl. No. 61/109,784, filed Oct. 30, 2008 and entitled Methods of Forming Layers of Semiconductor Material Having Reduced Lattice Strain, Semiconductor Structures, Devices and Engineered Substrates Including Same.

(Continued)

*Primary Examiner* — Kyoung Lee
(74) *Attorney, Agent, or Firm* — TraskBritt

(57) ABSTRACT

Methods of fabricating semiconductor structures and devices include bonding a seed structure to a substrate using a glass. The seed structure may comprise a crystal of semiconductor material. Thermal treatment of the seed structure bonded to the substrate using the glass may be utilized to control a strain state within the seed structure. The seed structure may be placed in a state of compressive strain at room temperature. The seed structure bonded to the substrate using the glass may be used for growth of semiconductor material, or, in additional methods, a seed structure may be bonded to a first substrate using a glass, thermally treated to control a strain state within the seed structure and a second substrate may be bonded to an opposite side of the seed structure using a non-glassy material.

14 Claims, 4 Drawing Sheets

U.S. PATENT DOCUMENTS

| | | |
|---|---|---|
| 6,362,077 B1 | 3/2002 | Aspar et al. |
| 6,372,609 B1 | 4/2002 | Aga et al. |
| 6,440,494 B1 | 8/2002 | Arena-Foster |
| 6,465,327 B1 | 10/2002 | Aspar et al. |
| 6,558,998 B2 | 5/2003 | Belleville |
| 6,559,075 B1 | 5/2003 | Kelly et al. |
| 6,740,604 B2 | 5/2004 | Kelly et al. |
| 6,756,286 B1 | 6/2004 | Moriceau et al. |
| 6,808,967 B1 | 10/2004 | Aspar et al. |
| 6,809,009 B2 | 10/2004 | Aspar et al. |
| 6,809,044 B1 | 10/2004 | Aspar et al. |
| 6,946,365 B2 | 9/2005 | Aspar |
| 7,060,590 B2 | 6/2006 | Bressot et al. |
| 7,067,396 B2 | 6/2006 | Aspar et al. |
| RE39,484 E | 2/2007 | Bruel |
| 7,176,108 B2 | 2/2007 | Cayrefourcq et al. |
| 7,208,392 B1 | 4/2007 | Jaussaud et al. |
| 7,229,899 B2 | 6/2007 | Moriceau et al. |
| 7,271,416 B2 | 9/2007 | Saxler |
| 7,300,853 B2 | 11/2007 | Joly et al. |
| 7,332,030 B2 | 2/2008 | Bruel |
| 7,341,925 B2 | 3/2008 | Kelly et al. |
| 2002/0148720 A1 | 10/2002 | Arena-Foster et al. |
| 2003/0064535 A1 | 4/2003 | Kub et al. |
| 2004/0097022 A1 | 5/2004 | Werkhoven et al. |
| 2004/0161904 A1 | 8/2004 | Berne et al. |
| 2004/0166649 A1 | 8/2004 | Bressot et al. |
| 2004/0171232 A1 | 9/2004 | Cayrefourcq et al. |
| 2004/0259333 A1 | 12/2004 | Tomasini et al. |
| 2005/0051795 A1 | 3/2005 | Arena et al. |
| 2006/0234504 A1 | 10/2006 | Bauer et al. |
| 2007/0072324 A1* | 3/2007 | Krames et al. .............. 438/46 |
| 2007/0264801 A1 | 11/2007 | Cody et al. |
| 2008/0026149 A1 | 1/2008 | Tomasini et al. |
| 2008/0057678 A1 | 3/2008 | Gadkaree |
| 2010/0109126 A1 | 5/2010 | Arena |
| 2010/0176490 A1 | 7/2010 | Letertre et al. |

FOREIGN PATENT DOCUMENTS

| | | |
|---|---|---|
| WO | 9642105 A1 | 12/1996 |
| WO | 9919532 A1 | 4/1999 |
| WO | 9936951 A1 | 7/1999 |
| WO | 0003429 A1 | 1/2000 |
| WO | 0024059 A1 | 4/2000 |
| WO | 0118853 A1 | 3/2001 |
| WO | 0177407 A1 | 10/2001 |
| WO | 03096385 A2 | 11/2003 |
| WO | 03096385 A3 | 7/2004 |
| WO | 2004066380 A1 | 8/2004 |
| WO | 2004081986 A2 | 9/2004 |
| WO | 2004081987 A2 | 9/2004 |
| WO | 2004081986 A3 | 11/2004 |
| WO | 2004081987 A3 | 1/2006 |
| WO | 2006083821 A1 | 8/2006 |
| WO | 2007140375 A2 | 12/2007 |
| WO | 2007143743 A2 | 12/2007 |
| WO | 2007140375 A3 | 1/2008 |
| WO | 2007143743 A3 | 3/2008 |

OTHER PUBLICATIONS

Hobart et al., Compliant Substrates: A Comparative Study of the Relaxation Mechanisms of Strained Films Bonded to High and Low Viscosity Oxides, Journal of Electronic Materials (2000), vol. 29, No. 7, pp. 897-900.

International Search Report for International Application No. PCT/IB2010/002542 mailed Mar. 3, 2011, 4 pages.

International Written Opinion for International Application No. PCT/IB2010/002542 mailed Mar. 3, 2011, 8 pages.

Lee et al., Inductively Coupled Cl2/Ar/O2 Plasma Etching of GaN, InGaN, and AlGaN, Journal of the Korean Physical Society, Dec. 2000; 37(6):842-845.

Letertre et al., U.S. Appl. No. 61/099,829, filed Sep. 24, 2008 and entitled Methods of Forming Relaxed Layers of Semiconductor Materials, Semiconductor Structures, Devices and Engineered Substrates Including Same.

Mileham et al., Wet Chemical Etching of AlN, Appl. Phys. Lett., Aug. 1995; 67(8):1119-1121.

* cited by examiner

SEMICONDUCTOR STRUCTURES AND DEVICES INCLUDING SEMICONDUCTOR MATERIAL ON A NON-GLASSY BONDING LAYER

CROSS-REFERENCE TO RELATED APPLICATIONS

This application is a divisional of U.S. patent application Ser. No. 12/890,220, filed Sep. 24, 2010, now U.S. Pat. No. 8,114,754, issued Feb. 14, 2012, which application claims the benefit of U.S. Provisional Patent Application Ser. No. 61/262,391, filed Nov. 18, 2009, and U.S. Provisional Patent Application Ser. No. 61/286,680, filed Dec. 15, 2009, the disclosure of each of which is hereby incorporated herein in its entirety by this reference.

FIELD

The present invention generally relates to methods of fabricating semiconductor structures and devices using engineered substrates, to intermediate structures formed during the fabrication of semiconductor structures and devices, to engineered substrates for use in the fabrication of semiconductor structures and devices, and to semiconductor devices formed using engineered substrates.

BACKGROUND

Substrates that include one or more layers of semiconductor material are used to form a wide variety of semiconductor structures and devices including, for example, integrated circuits (ICs) (e.g., logic processors and memory devices), radiation emitting devices (e.g., light emitting diodes (LEDs), resonant cavity light emitting diodes (RCLEDs), and vertical cavity surface emitting lasers (VCSELs)), radiation absorbing devices (e.g., optical sensors and solar cells) and switching/rectifying devices (e.g., power electronic devices). Such devices may comprise bipolar junction transistors (BJTs), power metal-oxide-field-effect-transistor (MOSFETS), thyristors, schottky diodes, junction field effect transistors (JFETs), insulated gate bipolar transistors (IGBTs) and PIN diodes. Such semiconductor devices are conventionally formed in a layer-by-layer manner (i.e., lithographically) on a semiconductor substrate.

Historically, a majority of such semiconductor substrates that have been used in the semiconductor device manufacturing industry have comprised thin discs or "wafers" of silicon material. Such wafers of silicon material are fabricated by first forming a large generally cylindrical silicon single crystal ingot, and subsequently slicing the single crystal ingot perpendicularly to its longitudinal axis to form a plurality of silicon wafers. Such silicon wafers may have diameters as large as about thirty centimeters (30 cm) or more (about twelve inches (12 in.) or more). Although silicon wafers generally have thicknesses of several hundred microns (e.g., about 700 microns) or more, only a very thin layer (e.g., less than about three hundred nanometers (300 nm)) of the semiconductor material on a major surface of the silicon wafer is actually used to form active devices on the silicon wafer.

It has been discovered that the speed and power efficiency of semiconductor devices can be improved by electrically insulating the portion of the semiconductor material that is actually used to form the semiconductor devices from the remaining bulk semiconductor material of the substrate. In addition, it has more generally been discovered that providing the semiconductor material used to form the semiconductor devices upon a base substrate, comprising one or more materials, allows for "engineering" of the properties of the semiconductor material.

As a result, so-called "engineered substrates" have been developed that may include a relatively thin layer of semiconductor material (e.g., a layer having a thickness of less than about three hundred microns (300 μm)) disposed upon one or more other material, such as, for example, dielectric material (e.g., silicon dioxide ($SiO_2$), silicon nitride ($Si_3N_4$), silicon carbide (SiC), silicon (Si) or aluminum oxide ($Al_2O_3$)). Optionally, the layer of dielectric material may be relatively thin (e.g., too thin to enable handling by conventional semiconductor device manufacturing equipment), and the layer or layers of material over which the semiconductor material is disposed (i.e., the base substrate) may be thick enough to enable handling of the engineered substrate by manufacturing equipment.

A wide variety of engineered substrates are known in the art and may include semiconductor materials such as, for example, silicon (Si), germanium (Ge), silicon carbide (SiC), III-V type semiconductor materials, and II-VI type semiconductor materials.

For example, an engineered substrate may include an epitaxial layer of III-V type semiconductor material on a surface of a base substrate, such as, for example aluminum oxide ($Al_2O_3$) (which is often referred to as "sapphire"). Using such an engineered substrate, additional layers of material may be foamed and processed (e.g., patterned) over the epitaxial layer of III-V type semiconductor material to form one or more semiconductor devices on the engineered substrate.

When a layer of semiconductor material is epitaxially grown at elevated temperatures upon an engineered substrate, lattice strain may be induced in the crystal lattice of the layer of semiconductor material. The strain in the semiconductor material may result from a lattice parameter mismatch between the crystal lattice of the underlying materials of the engineered substrate and that of the semiconductor material being formed thereon (e.g., the underlying material has one or more lattice constants that differ from that of the semiconductor material).

In addition, a lattice strain may also be induced in the crystal lattice of the semiconductor material during epitaxial growth at elevated temperature due to a difference in the coefficients of thermal expansion (CTE) exhibited by the respective adjacent materials. For example, if the underlying engineered substrate has a mean CTE which is greater than that of the semiconductor material being grown upon the engineered substrate, the semiconductor material may be grown in a state of tensile strain. Such a state of tensile strain may increase during the growth of the semiconductor material as the layer thickness increases, and may eventually result in the formation of defects in the semiconductor layer. Such defects may include, for example, dislocations and cracks.

BRIEF SUMMARY

Embodiments of the present invention may be used to provide layers of semiconductor material over engineered substrates having reduced lattice strain, which may enable the formation of relatively thicker layers of high-quality semiconductor material using the engineered substrates. As a result, embodiments of the present invention may be used to provide improved semiconductor devices.

In some embodiments, the present invention includes methods of fabricating semiconductor structures and devices in which at least one seed structure is bonded to a carrier substrate using a glass bonding layer. The at least one seed structure is at least substantially comprised by a single crystal of semiconductor material. At least one layer of semiconductor material may be deposited over the at least one seed structure at a temperature above a glass transition temperature of a glass material of the glass bonding layer while the at least one seed structure is supported on the glass bonding layer.

In additional embodiments, the present invention includes methods of fabricating semiconductor structures and devices in which at least one seed structure is bonded to a first carrier substrate using a glass bonding layer. The at least one seed structure is at least substantially comprised by a single crystal of semiconductor material. A second carrier substrate is bonded to the at least one seed structure on a side thereof opposite the first carrier substrate using a non-glassy bonding layer. The first carrier substrate and the glass bonding layer may be removed from the at least one seed structure, and the single crystal of semiconductor material of the at least one seed structure may be expanded using the thermal expansion of the second carrier substrate while heating the at least one seed structure, the non-glassy bonding layer, and the second carrier substrate. At least one layer of semiconductor material may be deposited over the at least one seed structure on a side thereof opposite the second carrier substrate and the non-glassy bonding layer while the single crystal of semiconductor material is in an expanded state at least partially caused by the thermal expansion of the second carrier substrate.

Additional embodiments of the present invention include semiconductor structures and devices formed by the methods described herein. Such semiconductor structures and devices include, for example, integrated circuits (ICs) (e.g., logic processors and memory devices), radiation emitting devices (e.g., light emitting diodes (LEDs), resonant cavity light emitting diodes (RCLEDs), and vertical cavity surface emitting lasers (VCSELs)), radiation absorbing devices (e.g., optical sensors and solar cells) and switching/rectifying devices (e.g., power electronic devices). Such devices may comprise bipolar junction transistors (BJTs), power metal-oxide-field-effect-transistor (MOSFETS), thyristors, schottky diodes, junction field effect transistors (JFETs), insulated gate bipolar transistors (IGBTs) and PIN diodes.

BRIEF DESCRIPTION OF THE SEVERAL VIEWS OF THE DRAWINGS

While the specification concludes with claims particularly pointing out and distinctly claiming what are regarded as embodiments of the present invention, the advantages of this invention may be more readily ascertained from the description of embodiments of the invention when read in conjunction with the accompanying drawings, in which:

DETAILED DESCRIPTION

Figure 1:
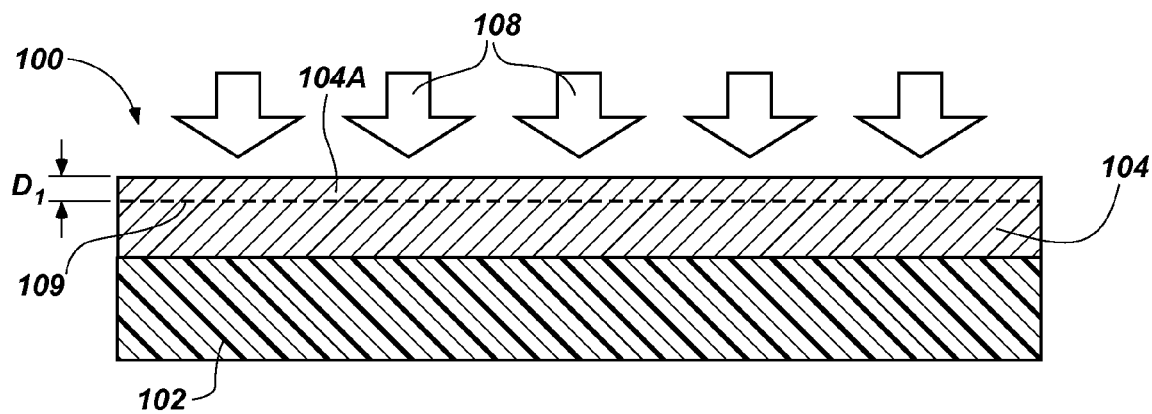
FIG. 1 is a simplified cross-sectional view of an intermediate structure that may be formed during embodiments of methods of the present invention and that includes a layer of semiconductor material on a first substrate.

The illustrations presented herein are not meant to be actual views of any particular semiconductor material, structure, or device, but are merely idealized representations that are employed to describe embodiments of the present invention. Additionally, elements common between figures may retain the same numerical designation.

As used herein, the term "III-V type semiconductor material" means and includes any semiconductor material that is at least predominantly comprised of one or more elements from group IIIA of the periodic table (B, Al, Ga, In, and Ti) and one or more elements from group VA of the periodic table (N, P, As, Sb, and Bi).

As used herein, the term "II-VI type semiconductor material" means and includes any semiconductor material that is at least predominantly comprised of one or more elements from group IIB of the periodic table (Zn, Cd, and Hg) and one or more elements from group VIA of the periodic table (O, S, Se, Te, and Po).

As used herein, the term "coefficient of thermal expansion," when used with respect to a material or structure, means the average linear coefficient of thermal expansion of the material or structure at room temperature.

As used herein, the term "engineered substrate" means and includes any substrate that includes a relatively thin layer of semiconductor material (e.g., a layer having an average thickness of less than about three hundred microns (300 μm)) disposed over (e.g., on) another material and that is intended to be used as a substrate for the fabrication of one or more semiconductor devices thereon. Engineered substrates include, for example, semiconductor-on-insulator type substrates.

As used herein, the term "epitaxial layer of semiconductor material" means a layer of semiconductor material that is at least substantially comprised by a single crystal of the semiconductor material and that has been formed such that the single crystal exhibits a known crystallographic orientation.

As used herein, the term "lattice strain," when used with respect to a layer of crystalline material, means strain of the crystal lattice in directions at least substantially parallel to the plane of the layer of material. Similarly, the term "average lattice parameter," when used with respect to a layer of material, means the average lattice parameters in dimensions at least substantially parallel to the plane of the layer of material.

As used herein, the term "reflow" means and includes heating or otherwise treating a material such that it is softened or has a decreased viscosity so that it may redistribute in space.

The term "relaxed," when used in relation to a layer of material, means and includes a layer of material that is at least substantially free of lattice strain. The term "relaxing" means reducing (e.g., relieving) lattice strain in a layer of material.

As used herein, the term "seed structure" means and includes any volume of material comprising a crystal of semiconductor material that is used as a substrate for growing or otherwise depositing additional semiconductor material thereon. Seed structures include, for example, seed layers, as well as structures formed by patterning seed layers, as described in further detail hereinbelow.

Embodiments of the present invention include methods and structures that facilitate the epitaxial fabrication of relatively thick layers of semiconductor material (such as, for example, epitaxial layers of III-V type semiconductor materials) that have relatively lower concentrations of defects therein, when compared to previously known, conventional epitaxial layers of such semiconductor materials. Example embodiments of methods of fabricating semiconductor structures or devices that include such epitaxial layers of semiconductor material are described below with reference to the figures.

Referring to FIG. 1, a first intermediate structure 100 may be fabricated or otherwise provided that includes a layer of substantially relaxed semiconductor material 104. In other words, the layer of semiconductor material 104 may be at least substantially free of lattice strain at room temperature. A portion of the layer of semiconductor material 104 may be used to provide a seed layer on an engineered substrate for use in forming one or more additional layers of semiconductor material thereon as part of the fabrication of an active semiconductor device, as described in further detail below.

As shown in FIG. 1, in some embodiments, the layer of semiconductor material 104 may be attached to and carried by a sacrificial substrate 102. In additional embodiments, however, the semiconductor material 104 may comprise a free-standing, bulk layer of semiconductor material 104 that is not disposed on or carried by a sacrificial substrate 102 or any other material.

In some embodiments, the layer of semiconductor material 104 may comprise an epitaxial layer of semiconductor material. By way of example and not limitation, the layer of semiconductor material 104 may comprise an epitaxial layer of III-V type semiconductor material. For example, the layer of semiconductor material 104 may comprise an epitaxial layer of gallium nitride (GaN).

The sacrificial substrate 102 may be at least substantially comprised of, for example, aluminum oxide ($Al_2O_3$) (e.g., sapphire), zinc oxide (ZnO), silicon (Si), silicon carbide (SiC), gallium arsenide (GaAs), lithium gallate ($LiGaO_2$), lithium aluminate ($LiAlO_2$), yttrium aluminum oxide ($Y_3Al_5O_{12}$), or magnesium oxide (MgO).

Optionally, one or more intermediate layers of material (not shown), such as another layer of semiconductor material, may be disposed between the layer of semiconductor material 104 and the sacrificial substrate 102. Such intermediate layers of material may be used, for example, as a seed layer for forming the layer of semiconductor material 104 thereon, or as a bonding layer for bonding the layer of semiconductor material 104 to the sacrificial substrate 102, when it is difficult or impossible to form the layer of semiconductor material 104 directly on the sacrificial substrate 102. In addition, bonding of the layer of semiconductor material 104 to the sacrificial substrate 102 may be desired if semiconductor material 104 is polar. In such embodiments, the bonding process may be utilized to alter the polarity of the polar semiconductor material. The figures are not shown to scale, and, in actuality, the layer of semiconductor material 104 may be relatively thin compared to the sacrificial substrate 102.

To form the intermediate structure 100 shown in FIG. 1, the layer of semiconductor material 104 may be epitaxially grown or otherwise formed or provided on a major surface of the sacrificial substrate 102. Any of various methods known in the art may be used to reduce the density of dislocations in the layer of semiconductor material 104 as the layer of semiconductor material 104 is formed on the sacrificial substrate 102. Such methods include, for example, epitaxial lateral overgrowth (ELO), pendeo-epitaxy, in-situ masking techniques, etc.

The sacrificial substrate 102 may exhibit a coefficient of thermal expansion that differs from a coefficient of thermal expansion exhibited by the layer of semiconductor material 104. For example, if the sacrificial substrate 102 exhibits a coefficient of thermal expansion that is lower than the coefficient of thermal expansion exhibited by the layer of semiconductor material 104, the crystal lattice of the layer of semiconductor material 104 may be in a state of compressive lattice strain upon heating the intermediate structure 100 to an elevated temperature, as atomic bonds between the sacrificial substrate 102 and the layer of semiconductor material 104 may prevent the crystal lattice of the layer of semiconductor material 104 from expanding to equilibrium dimensions for the given elevated temperature. By equilibrium dimensions, it is meant the dimensions that would be exhibited by the layer of semiconductor material 104 at a given temperature and pressure if it were not attached to the sacrificial substrate 102. If the sacrificial substrate 102 exhibits a coefficient of thermal expansion that is higher than the coefficient of thermal expansion exhibited by the layer of semiconductor material 104, the crystal lattice of the layer of semiconductor material 104 may be in a state of tensile lattice strain upon heating the intermediate structure 100 to an elevated temperature, as atomic bonds between the sacrificial substrate 102 and the layer of semiconductor material 104 may "stretch" the crystal lattice of the layer of semiconductor material 104 beyond equilibrium dimensions for the given elevated temperature.

In additional embodiments, the intermediate structure of FIG. 1 may not include a sacrificial substrate 102, and may simply comprise a free-standing, bulk layer of semiconductor material 104. For example, bulk material 104 may comprise a free-standing gallium nitride substrate.

Figure 2:
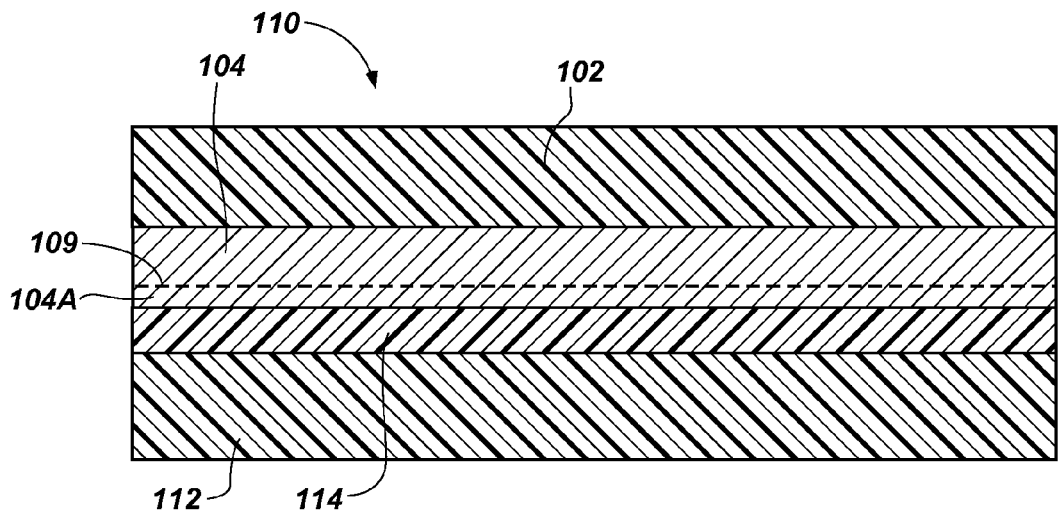
FIG. 2 is a simplified cross-sectional view of another intermediate structure that may be formed by attaching a second substrate to the intermediate structure of FIG. 1.

Referring to FIG. 2, a carrier substrate 112 may be bonded to the layer of semiconductor material 104 on a side thereof opposite the sacrificial substrate 102 using a glass bonding layer 114 to form another intermediate structure 110. Thus, the glass bonding layer 114 may be disposed between the carrier substrate 112 and the layer of semiconductor material 104. The carrier substrate 112 and the layer of semiconductor material 104 may be bonded together by abutting the glass bonding layer 114 on the carrier substrate 112 against the layer of semiconductor material 104, and maintaining the resulting structure at a desired temperature and pressure for a sufficient amount of time in order to produce a sufficient bonding strength between the adjoining layers.

The carrier substrate 112 may exhibit a coefficient of thermal expansion greater than a coefficient of thermal expansion exhibited by the layer of semiconductor material 104. As non-limiting examples, the carrier substrate 112 may be at least substantially comprised of, for example, aluminum oxide ($Al_2O_3$) (e.g., sapphire), zinc oxide (ZnO), yttrium aluminum oxide ($Y_3Al_5O_{12}$), magnesium oxide (MgO), and metals or metal alloys such as HAYNES® Alloy 214 or HAYNES® Alloy 230.

The glass bonding layer 114 exhibits a glass transition temperature ($T_g$), below which the glass bonding layer 114 behaves in a brittle fashion, and above which the glass bonding layer 114 behaves in a ductile fashion. By way of non-limiting example, the glass bonding layer 114 may comprise at least one of an oxide glass, a phosphosilicate glass (PSG), a borosilicate glass (BSG), a borophosphosilicate glass (BPSG), a polyimide, a doped or undoped quasi-inorganic siloxane spin-on-glass (SOG), an inorganic spin-on-glass, and a doped or undoped silicate glass.

By way of example and not limitation, the glass bonding layer 114 may have a thickness in a range extending from about one-tenth of a micron (0.1 μm) to about ten microns (10 μm) and, more particularly, from about one micron (1 μm) to about five microns (5 μm).

Figure 3:
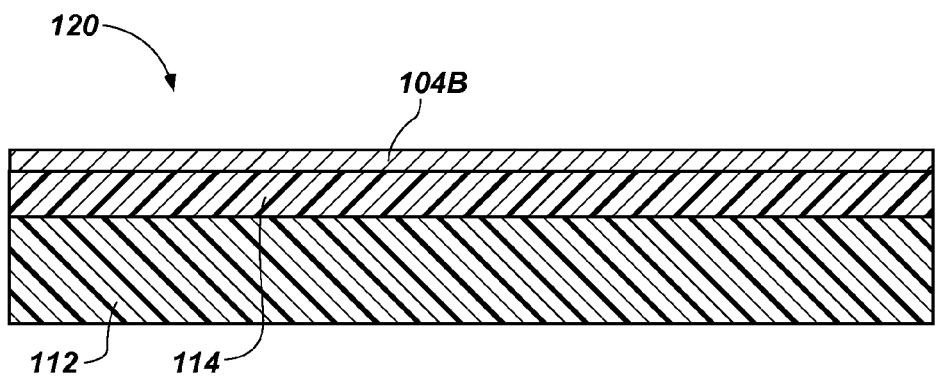
FIG. 3 is a simplified cross-sectional view illustrating another intermediate structure that may be formed by removing a portion of the layer of semiconductor material and the first substrate from the intermediate structure of FIG. 2.

Referring to FIG. 3, after bonding the carrier substrate 112 to the layer of semiconductor material 104 using the glass bonding layer 114, a portion 104A of the layer of semiconductor material 104, together with the carrier substrate 112, may be removed from the sacrificial substrate 102 (or the sacrificial substrate 102 may be removed from the layer of semiconductor material 104) to form a third intermediate structure 120 that includes a seed layer 104B formed from the portion 104A of the layer of semiconductor material 104. By way of example and not limitation, the process known in the industry as the SMARTCUT® process may be used to separate the portion 104A of the layer of semiconductor material 104 (and the carrier substrate 112) from the sacrificial substrate 102 and the remaining portion of the layer of semiconductor material 104. Such processes are described in detail in, for example, U.S. Pat. No. RE39,484 to Bruel (reissued Feb. 6, 2007), U.S. Pat. No. 6,303,468 to Aspar et al. (issued Oct. 16, 2001), U.S. Pat. No. 6,335,258 to Aspar et al. (issued Jan. 1, 2002), U.S. Pat. No. 6,756,286 to Moriceau et al. (issued Jun. 29, 2004), U.S. Pat. No. 6,809,044 to Aspar et al. (issued Oct. 26, 2004), and U.S. Pat. No. 6,946,365 to Aspar et al. (issued Sep. 20, 2005), the disclosures of each of which are incorporated herein in their entirety by this reference.

Briefly, referring again to FIG. 1, a plurality of ions (e.g., hydrogen, helium, or inert gas ions) may be implanted into the intermediate structure 100. For example, ions may be implanted into the layer of semiconductor material 104 from an ion source (not shown) positioned on a side of the intermediate structure 100 adjacent the layer of semiconductor material 104. As represented by directional arrows 108 shown in FIG. 1, ions may be implanted into the intermediate structure 100 along a direction substantially perpendicular to the layer of semiconductor material 104. As known in the art, the depth at which the ions are implanted into the intermediate structure 100 is at least partially a function of the energy with which the ions are implanted into the intermediate structure 100. Generally, ions implanted with less energy will be implanted at relatively shallower depths, while ions implanted with higher energy will be implanted at relatively deeper depths.

Ions may be implanted into the intermediate structure with a predetermined energy selected to implant the ions at a desired depth $D_1$ within the intermediate structure 100 (e.g., within the layer of semiconductor material 104). As one particular non-limiting example, in some embodiments, an ion implant layer 109 may be disposed within the layer of semiconductor material 104 at a depth $D_1$ in a range extending from about one hundred nanometers (100 nm) to about three hundred nanometers (300 nm) below the exposed major surface of the layer of semiconductor material 104. As known in the art, inevitably at least some ions may be implanted at depths other than the desired implantation depth $D_1$, and a graph of the concentration of the ions as a function of depth into the intermediate structure 100 from the exposed surface of the layer of semiconductor material 104 may exhibit a generally bell-shaped (symmetric or asymmetric) curve having a maximum at the desired implantation depth $D_1$.

Upon implantation into the intermediate structure 100, the ions may define the ion implant layer 109 (illustrated as a dashed line in FIG. 1) within the intermediate structure 100. The ion implant layer 109 may comprise a layer or region within the intermediate structure 100 that is aligned with (e.g., centered about) the plane of maximum ion concentration with the intermediate structure 100. The ion implant layer 109 may define a zone of weakness within the intermediate structure 100 along which the intermediate structure 100 may be cleaved or fractured in a subsequent process, as described in further detail below.

In some embodiments of the present invention, the ion implant layer 109 may be disposed in the layer of semiconductor material 104. In other words, the ion implant layer 109 may be disposed entirely within the layer of semiconductor material 104. In additional embodiments, the ion implant layer 109 may be disposed entirely within an intermediate layer of semiconductor material between the sacrificial substrate 102 and the layer of semiconductor material 104, or partially within the layer of semiconductor material 104 and partially within an intermediate layer of semiconductor material.

After attaching the carrier substrate 112 to the layer of semiconductor material 104 on a side thereof opposite the sacrificial substrate 102 to form the intermediate structure 110, as previously described with reference to FIG. 2, the intermediate structure 110 may be subjected to one or more further treatments, such as, for example mechanical, chemical or thermal treatments, to cause the intermediate structure 110 to cleave or fracture along the ion implant layer 109, thereby forming the intermediate structure 120 shown in FIG. 3. In other words, the portion 104A of the layer of semiconductor material 104 may be delaminated from the remaining portion of the layer of semiconductor material 104 and the underlying sacrificial substrate 102 upon, for example, thermally treating the intermediate structure 110 to form the seed layer 104B. Additional semiconductor material may be grown on the seed layer 104B, as discussed in further detail below.

By way of example and not limitation, after attaching the carrier substrate 112 to the layer of semiconductor material 104 to form the intermediate structure 110, the temperature of the intermediate structure 110 may be maintained at an elevated temperature (i.e., above about 100° C.) for an amount of time sufficient to cause the implanted ions within the ion implant layer 109 to coalesce and form a plurality of microcavities and/or inclusions. The elevated temperature at which this thermal treatment process is carried out may be at, below, or above a temperature at which the carrier substrate 112 is attached to the layer of semiconductor material 104. Furthermore, the dose of the ion implantation process used to form the ion implant layer 109 (and, hence, the concentration of ions in the ion implant layer 109) may be tailored such that the thermal budget (i.e., the heat input) required to cause the intermediate structure 110 to fracture along the ion implant layer 109 is greater than the thermal budget required to bond the carrier substrate 112 to the layer of semiconductor material 104 to ensure that the intermediate structure 110 does not fracture along the ion implant layer 109 before the carrier substrate 112 is attached to the layer of semiconductor material 104.

In some embodiments of the present invention, after thermally treating the intermediate structure 110 (FIG. 2) to structurally weaken the ion implant layer 109, splitting of the intermediate structure 110 along the ion implant layer 109 may be initiated by changing a temperature of the intermediate structure 110. As the temperature of the intermediate structure 110 is changed, differences in the coefficients of thermal expansion of the sacrificial substrate 102 and the carrier substrate 112 may result in the generation of stresses within the intermediate structure 110 that will ultimately lead to fracture of the intermediate structure 110 along the thermally treated ion implant layer 109. As a non-limiting example, splitting of the intermediate structure 110 along the ion implant layer 109 may be initiated as the intermediate structure 110 is cooled (e.g., to room temperature) after thermally treating the intermediate structure 110 to structurally weaken the ion implant layer 109.

Embodiments of the present invention are not limited to use of a SMARTCUT® process for separating the portion 104A of the layer of semiconductor material 104 and the carrier substrate 112 from the sacrificial substrate 102 and the remaining portion of the layer of semiconductor material 104. In additional embodiments of methods of the present invention, other methods such as, for example, etching processes, grinding processes, and laser lift-off processes may be used to separate the portion 104A of the layer of semiconductor material 104 and the carrier substrate 112 from the sacrificial substrate 102 and the remaining portion of the layer of semiconductor material 104.

The intermediate structure 120 shown in FIG. 3 optionally may be used as an engineered substrate, and an active device may be fabricated on the intermediate structure 120 by, for example, growing additional device layers of semiconductor material on and over the seed layer 104B. As discussed in further detail below, the glass bonding layer 114 may facilitate relaxation of the seed layer 104B upon subsequent processing.

Figure 4A:
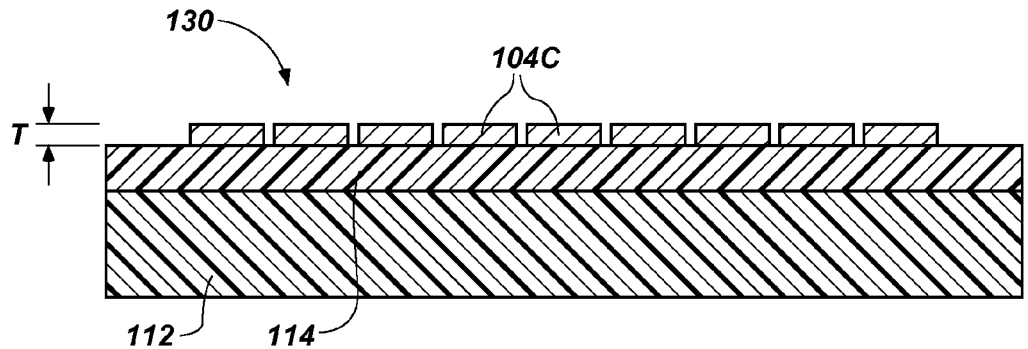
FIG. 4A is a simplified cross-sectional view of another intermediate structure that may be formed by patterning the remaining portion of the layer of semiconductor material on the intermediate structure of FIG. 3.
Figure 4B:
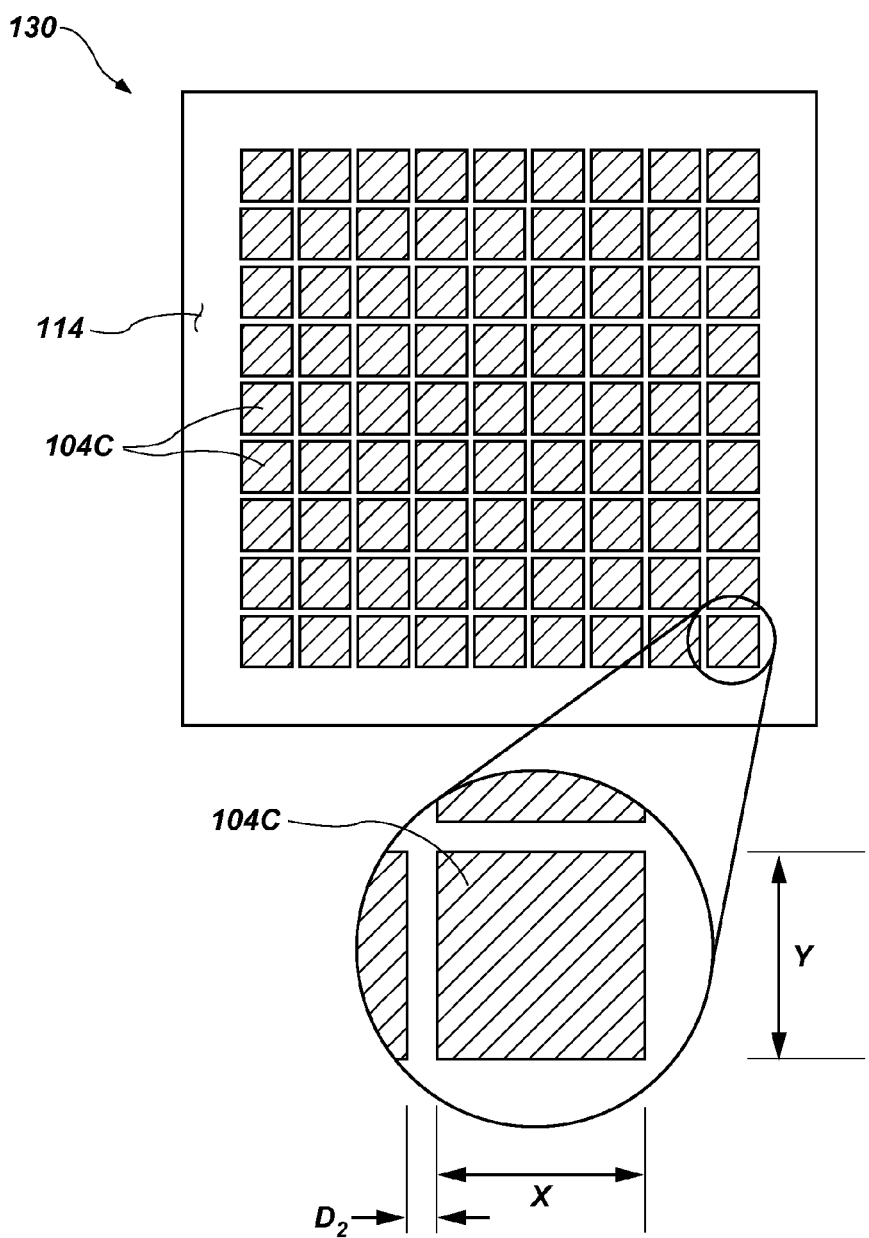
FIG. 4B is a top plan view of the intermediate structure shown in FIG. 4A.

In some embodiments, prior to growing additional semiconductor material on the seed layer 104B, the seed layer 104B may be patterned to form an intermediate structure 130 that includes a plurality of seed structures 104C, as shown in FIGS. 4A and 4B, which may further assist in the relaxation of the semiconductor material of the seed layer 104B and the seed structures 104C upon subsequent processing. By way of example and not limitation, the seed layer 104B (FIG. 3) may be patterned as disclosed in provisional U.S. Patent Application Ser. No. 61/099,829, which was filed Sep. 24, 2008 and entitled Methods Of Forming Relaxed Layers Of Semiconductor Materials, Semiconductor Structures, Devices And Engineered Substrates Including Same, and in provisional U.S. Patent Application Ser. No. 61/109,784, which was filed Oct. 30, 2008 and entitled Methods Of Forming Layers Of Semiconductor Material Having Reduced Lattice Strain, Semiconductor Structures, Devices And Engineered Substrates Including Same, the disclosures of which are incorporated herein in their entireties by this reference.

For example, masking and etching processes known in the art may be used to pattern the seed layer 104B (FIG. 3) to form one or more seed structures 104C (FIGS. 4A and 4B) from the seed layer 104B. Briefly, a mask layer may be formed and processed (e.g., patterned) over the seed layer 104B of the intermediate structure 120 of FIG. 3. The composition and thickness of the mask layer may be selected based on the desired etch depth and resistance with respect to underlying materials, such as the seed layer 104B and the glass bonding layer 114. As a non-limiting example, the mask layer may comprise a photoresist material or a hard mask material, such as an oxide material, a nitride material, or a metal material (i.e., chromium or titanium). A plurality of apertures may be provided through the mask layer to expose areas of the surface of the seed layer 104B to be etched through the mask layer.

A portion of the seed layer 104B may be removed through the apertures in the mask layer using, for example, a dry etching process such as reactive ion etching, or a high density plasma etching process, such as inductively coupled plasma (ICP) etching. In addition, a wet chemical etching process may also be utilized. For example, acidic or basic etch solution processes may be utilized. Such processes are utilized to from a plurality of seed structures 104C, each comprising the semiconductor material of the seed layer 104B (and the layer of semiconductor material 104). As a non-limiting example, in embodiments in which the seed layer 104B comprises gallium nitride and the glass bonding layer 114 comprises borophosphosilicate glass, the mask layer may comprise a photoresist material, and a chlorine-based plasma etch process (e.g., ICP) may be used to remove the gallium nitride selective to the borophosphosilicate glass and the photoresist material to form seed structures 104C comprising gallium nitride. In other words, the gallium nitride may be removed by the plasma at a rate that is significantly higher than the rate or rates at which the plasma removes the borophosphosilicate glass and the photoresist material until the seed structures 104C are defined. After formation of the seed structures 104C, the remaining mask layer may be removed from the structure. In certain embodiments, the etch process, in addition to etching seed structures 104C, may also etch portions of the glass bonding layer 114 such that the plurality of trenches formed in seed layer 104B may continue through the seed layer 104B and into glass bonding layer 114.

Each of the seed structures 104C may comprise a volume of semiconductor material supported on and carried by the glass bonding layer 114, as shown in FIGS. 4A and 4B. By way of example and not limitation, the seed structures 104C may be generally rectangular in shape, and may be formed to have lateral dimensions X and Y of between about five microns (5 µm) and about one millimeter (1 mm) (e.g., about five hundred microns (500 µm)). Each seed structure 104C may be spaced from adjacent seed structures 104C by a distance $D_2$ of between about one micron (1 µm) and about one hundred microns (100 µm).

Figure 5:
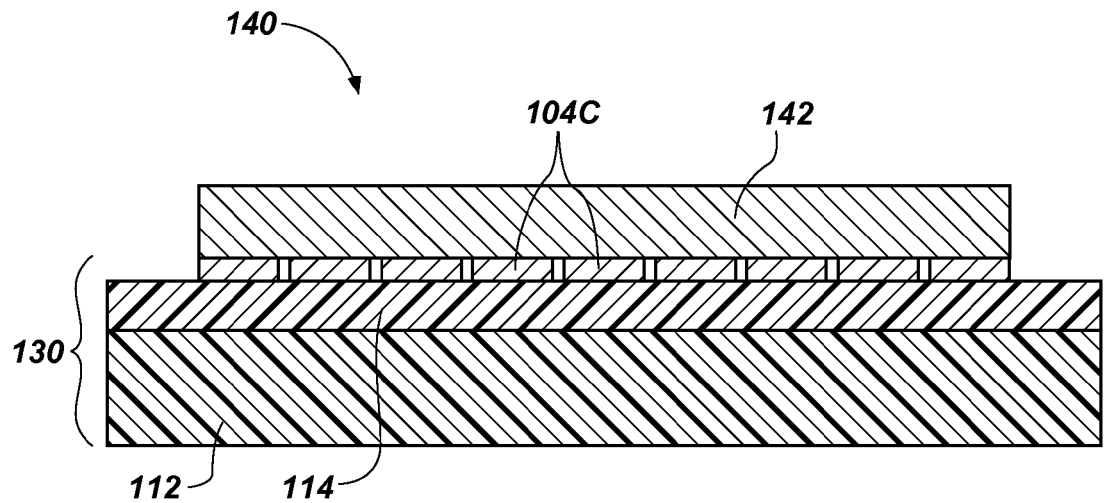
FIG. 5 is a simplified cross-sectional view of another intermediate structure that may be formed by growing additional semiconductor material over the patterned semiconductor material on the intermediate structure of FIGS. 4A and 4B.

Referring to FIG. 5, another layer of semiconductor material 142 may be epitaxially grown over the seed structures 104C to form an intermediate structure 140 as shown in FIG. 5. The seed structures 104C may serve as templates for the epitaxial layer of semiconductor material 142 grown over the seed structures 104C. The epitaxial layer of semiconductor material 142 may include a single layer of semiconductor material or multiple layers of semiconductor material. As a non-limiting example, the epitaxial layer of semiconductor material 142 may include a III-V type semiconductor material and the glass bonding layer 114 may be formed from a material that acts as an anti-surfactant to growth of the III-V type semiconductor material of the layer of semiconductor material 142. In other words, the material composition of the glass bonding layer 114 may at least substantially prevent nucleation and growth of the III-V nitride material thereon. As non-limiting examples, the layer of semiconductor material 142 may be GaN, or $In_yGa_{1-y}N$, wherein y represents a number between 0.01 and 0.25, such as, for example, 0.05 or 0.10.

The epitaxial layer of semiconductor material 142 may be deposited, for example, using a high-temperature process, such as metalorganic chemical vapor deposition (MOCVD), molecular beam epitaxy (MBE), or hydride vapor phase epitaxy (HVPE), and may be deposited at a temperature sufficient to decrease the viscosity of the glass bonding layer 114.

By way of non-limiting example, the epitaxial layer of semiconductor material 142 may be deposited at a temperature greater than or equal to the glass transition temperature ($T_g$) of the glass bonding layer 114, at which point the viscosity of the glass bonding layer 114 may decrease and allow the glass material of the glass bonding layer 114 to begin to reflow. The material composition of the glass bonding layer 114 may be selected so that it may be reflowed or otherwise softened at a temperature equal to or below the temperature at which the epitaxial layer of semiconductor material 142 is deposited. As a non-limiting example, the glass bonding layer 114 may comprise borophosphosilicate glass (BPSG) and the epitaxial layer of semiconductor material 142 may be formed at a temperature determined based on the percentage content of boron and phosphorous. More particularly, where the glass bonding layer 114 is borophosphosilicate glass comprising 4% by weight boron and 4% by weight phosphorous, the glass bonding layer 114 may be exposed to a temperature of greater than about 600° C. during deposition of the epitaxial layer of semiconductor material 142. By heating the glass bonding layer 114 to a temperature sufficient to reflow the glass bonding layer 114 simultaneously with the deposition of the epitaxial layer of semiconductor material 142 (e.g., a temperature above the glass transition temperature $T_g$ of the glass bonding layer 114), the crystal lattices of the seed structures 104C, which are supported by and carried on the glass bonding layer 114, may be allowed to at least partially relax and relieve lattice strain therein prior to or during deposition of the epitaxial layer of semiconductor material 142.

In some embodiments, the epitaxial layer of semiconductor material 142 may comprise a material having a lattice constant substantially equal to a lattice constant of the semiconductor material of the seed structures 104C. In addition, the seed structures 104C and the epitaxial layer of semiconductor material 142 may possess a mean coefficient of thermal expansion that is less than that of the underlying intermediate structure 130.

During the high temperature growth processes utilized to grow epitaxial layer of semiconductor material 142, the tensile strain induced in the epitaxial layer of semiconductor material 142 due to the CTE mismatch with intermediate structure 130 may be compensated for by the presence of the glass bonding layer 114, since the glass bonding layer 114 may reflow at the elevated growth temperatures. Therefore, the degree of tensile strain in the seed structures 104C and the epitaxial layer of semiconductor material 142 may be decreased, thereby allowing the thickness of the epitaxial layer of semiconductor material 142 to be increased beyond the point at which defects and cracks may commonly form.

For example, consider the example where the seed structures 104C and the epitaxial layer of semiconductor material 142 each comprise gallium nitride, and the intermediate structure 130 comprises a BPSG glass bonding layer 114 and a sapphire carrier substrate 112. In this example, the mean CTE of the intermediate structure 130 is greater than that of the mean CTE of the seed structures 104C and the epitaxial layer of semiconductor material 142. As the temperature of the reactor is increased to form epitaxial layer of semiconductor material 142, the greater CTE of the sapphire carrier substrate 112 will begin to place the overlying semiconductor material in a tensile strain state. However, as the temperature of the reactor passes the glass transition temperature of the BPSG glass bonding layer 114, the glass bonding layer 114 will reflow, allowing the strain in the overlying semiconductor structures (104C and 142) to reduce (i.e., allowing strain relaxation in the semiconductor materials of the seed structures 104C and the epitaxial layer of semiconductor material 142).

In some embodiments, the epitaxial layer of semiconductor material 142 may comprise a material having a lattice constant that is greater than a lattice constant of the semiconductor material of the seed structures 104C and, therefore, may result in a force being applied to the crystal lattices of the seed structures 104C as the epitaxial layer of semiconductor material 142 is grown thereon. As the epitaxial layer of semiconductor material 142 is grown over the seed structures 104C while the glass bonding layer 114 is in a viscous and moveable state, the crystal lattices may be allowed to expand or contract during growth of the epitaxial layer of semiconductor material 142 in response to any force applied to the crystal lattices of the seed structures 104C by the growing epitaxial layer of semiconductor material 142.

For example, where the seed structures 104C and the epitaxial layer of semiconductor material 142 each comprise indium gallium nitride, the epitaxial layer of semiconductor material 142 may have a higher indium content in comparison to that of the seed structures 104C and, thus, a lattice constant greater than a lattice constant of the semiconductor material of the seed structures 104C. The larger lattice constant of the epitaxial layer of semiconductor material 142 may create a force that results in a tensile strain within the underlying seed structures 104C. As the glass bonding layer 114 is in a viscous state, however, the atoms of the seed structures 104C are allowed to strain throughout the thickness T (FIG. 4A) of the seed structures 104C, thereby resulting in reduced stress within the seed structures 104C and the epitaxial layer of semiconductor material 142.

In contrast, in prior art methods in which the underlying material supporting and carrying a seed layer is not in a viscous state as another layer of semiconductor material is epitaxially grown over the seed layer, the underlying material hinders movement of the atoms of the seed layer adjacent the underlying material, which may result in the generation of higher stresses within the seed layer and overlying layer(s) of semiconductor material, and increase the probability that defects will form within the seed layer and overlying layer(s) of semiconductor material.

Thus, in accordance with some embodiments of the present invention, the epitaxial layer of semiconductor material 142 formed as described herein may have a reduced number of defects therein for a given thickness and material composition when compared to epitaxial layers of semiconductor material formed to have such a thickness and material composition using methods known in the art.

By depositing the epitaxial layer of semiconductor material 142 over the seed structures 104C while the glass bonding layer 114 is in a viscous state (e.g., at a temperature above a glass transition temperature ($T_g$) of the glass material of the glass bonding layer 114), a strain balance may be obtained between the epitaxial layer of semiconductor material 142 and the seed structures 104C that allows the layer of semiconductor material 142 to grow in an at least partially relaxed state to relatively greater thickness with a reduced concentration of defects therein.

In some embodiments, the epitaxial layer of semiconductor material 142 may be grown over the seed structures 104C to an average thickness of about two microns (2 μm) or more. In additional embodiments, the epitaxial layer of semiconductor material 142 may be grown over the seed structures 104C to an average thickness of about six microns (6 μm) or more. In some embodiments of the invention, the epitaxial layer of semiconductor material 142 may have an average thickness of greater than about two microns (2 μm) and less than about 50 microns (50 μm).

By way of non-limiting example, if the seed structures 104C, as shown in FIG. 5, each comprise gallium nitride and the glass bonding layer 114 comprises borophosphosilicate glass, gallium nitride may be deposited over the seed structures 104C at or above a temperature at which the borophosphosilicate glass may be reflowed to allow expansion of the crystal lattice of the seed structures 104C. In additional embodiments, the seed structures 104C and the epitaxial layer of semiconductor material 142 may comprise other materials, and the seed structures 104C may contract during formation of the epitaxial layer of semiconductor material 142 and reflow of the glass bonding layer 114.

Thus, the epitaxial layer of semiconductor material 142 may be deposited having a lattice structure that is relatively more relaxed. By forming the epitaxial layer of semiconductor material 142 over the seed structures 104C while simultaneously reflowing the glass bonding layer 114 below the seed structures 104C, the epitaxial layer of semiconductor material 142 may be deposited above a critical thickness for the formation of defects thereof and, when comprised of InGaN, may include a higher percentage of indium than can conventionally be deposited without defect formation and phase separation.

In some embodiments, the epitaxial layer of semiconductor material 142 may comprise gallium nitride. As a non-limiting example, the seed structures 104C, as shown in FIG. 5, may also comprise GaN. The epitaxial layer of GaN 142 may be deposited by metalorganic chemical vapor deposition (MOCVD) at a temperature greater than about 600° C. and, more particularly, in a range extending from about 700° C. to about 1150° C., while the glass bonding layer 114 comprises a borophosphosilicate glass having a glass transition temperature ($T_g$) of about 700° C. or less and equal to or below the temperature at which the epitaxial layer of GaN 142 is deposited. In this way, the layer of GaN may be deposited in an at least partially relaxed state, which facilitates formation of an at least partially relaxed layer having an increased thickness, while reducing undesirable defects such as dislocations and cracks.

The carrier substrate 112 may comprise a material that exhibits a coefficient of thermal expansion that is greater than the coefficients of thermal expansion of the seed structures 104C and the epitaxial layer of semiconductor material 142. Thus, upon cooling, after the temperature of the intermediate structure 140 of FIG. 5 passes below the glass transition temperature $T_g$ of the glass bonding layer 114, the carrier substrate 112 will shrink due to thermal contraction at a faster rate than the seed structures 104C and the epitaxial layer of semiconductor material 142. As a result, the seed structures 104C and the epitaxial layer of semiconductor material 142 may be placed in a state of compression upon cooling to room temperature. By providing the seed structures 104C and the epitaxial layer of semiconductor material 142 in a state of compression, the probability that cracks and other defects may nucleate and propagate within the seed structures 104C and the epitaxial layer of semiconductor material 142 may be reduced.

Additional embodiments of the invention are described below with reference to FIGS. 6 through 8.

In accordance with additional embodiments of methods of the present invention, the intermediate structure 130 of FIGS. 4A and 4B may be fabricated as previously described herein with reference to FIGS. 1 through 4A and 4B.

After fabricating the intermediate structure 130 of FIGS. 4A and 4B, the intermediate structure 130 may be subjected to a thermal treatment process. The intermediate structure 130 may be heated to a temperature above the glass transition temperature ($T_g$) of the glass bonding layer 114 to allow the glass material of the glass bonding layer 114 to reflow, and the semiconductor material of the seed structures 104C thereon to relax and relieve any lattice strain therein. The intermediate structure 130 then may be allowed to cool, and as a result of the carrier substrate 112 exhibiting a higher coefficient of thermal expansion than the seed structures 104C, the thermal contraction of the carrier substrate 112, upon cooling below the glass transition temperature ($T_g$) of the glass bonding layer 114 to room temperature, may result in the crystal lattices of the seed structures 104C being placed in a state of compressive strain at room temperature.

After subjecting the intermediate structure 130 of FIGS. 4A and 4B to a thermal process to place the seed structures 104C in a state of compressive strain, the seed structures 104C may be transferred to a second carrier substrate to effectively flip the seed structures 104C upside down. Such a process may be desirable when seed structures 104C comprise polar semiconductor materials, as the flip process can reverse the polarity of the exposed major surface of the seed structures 104C.

Figure 6:
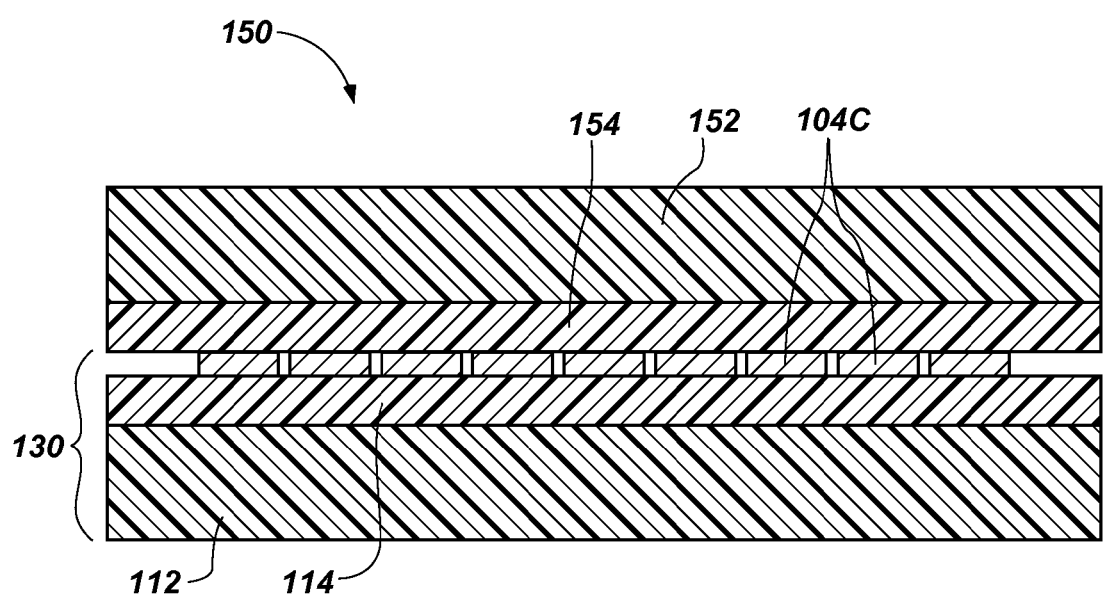
FIG. 6 is a simplified cross-sectional view of another intermediate structure that may be formed by attaching a third substrate to the intermediate structure of FIGS. 4A and 4B.

Referring to FIG. 6, a second carrier substrate 152 may be bonded to the seed structures 104C of the intermediate structure 130 using a non-glassy bonding layer 154. The seed structures 104C may be disposed between and bonded to each of the glass bonding layer 114 and the non-glassy bonding layer 154.

The second carrier substrate 152 may comprise a material that exhibits a coefficient of thermal expansion that is greater than a coefficient of thermal expansion exhibited by the semiconductor material of the seed structures 104C. By way of example and not limitation, the second carrier substrate 152 may be at least substantially comprised of any of the materials previously described in relation to the first carrier substrate 112, including, for example, aluminum oxide ($Al_2O_3$) (e.g., sapphire), zinc oxide (ZnO), yttrium aluminum oxide ($Y_3Al_5O_{12}$), magnesium oxide (MgO), and metals or metal alloys such as HAYNES® Alloy 214 or HAYNES® Alloy 230.

In some embodiments, the second carrier substrate 152 may be electrically conductive. For example, the carrier substrate 152 may exhibit an electrical conductivity of about 100 $(ohm-cm)^{-1}$ or more at room temperature. Furthermore, the carrier substrate 152 may be thermally conductive. For example, the carrier substrate 152 may exhibit a thermal conductivity of about 100 W/mK or more at room temperature.

The non-glassy bonding layer 154 may comprise, for example, at least one of an oxide material and a nitride material (e.g., $SiO_2$, $Si_3N_4$, or $SiO_xN_y$). In embodiments in which the carrier substrate 152 is electrically and thermally conductive, as discussed above, the non-glassy bonding layer 154 may comprise a metallic bonding layer (i.e., a layer of metal or metal alloy material). In addition, in embodiments in which the carrier substrate 152 is electrically and thermally conductive, the non-glassy bonding layer 154 may have a thickness of less than approximately 100 nm, such that the non-glassy bonding layer 154 may not have a detrimental effect on the overall thermal and electrical properties. Such embodiments may find particular utility for use in semiconductor devices that operate at relatively high powers and/or temperatures.

The second carrier substrate 152 and the seed structures 104C may be bonded together by abutting the non-glassy bonding layer 154 on the second carrier substrate 152 against the seed structures 104C, and maintaining a resulting intermediate structure 150 at a desired temperature and pressure for a sufficient amount of time in order to produce a sufficient bonding strength between the adjoining layers.

Figure 7:
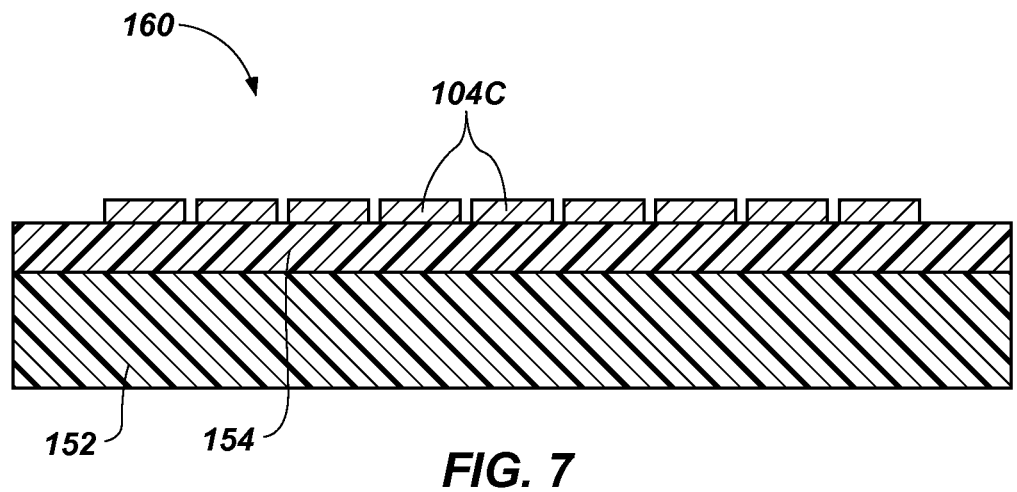
FIG. 7 is a simplified cross-sectional view of another intermediate structure that may be formed by removing the second substrate from the patterned semiconductor material and the third substrate of the intermediate structure of FIG. 6.

After attaching the second carrier substrate 152 to the seed structures 104C of the intermediate structure 130 using the non-glassy bonding layer 154, the first carrier substrate 112 and the glass bonding layer 114 may be separated or otherwise removed from the seed structures 104C, which remain bonded to the second carrier substrate 152 by the non-glassy bonding layer 154, to form an intermediate structure 160 shown in FIG. 7.

By way of example and not limitation, a laser lift-off process may be used to remove the first carrier substrate 112 from the seed structures 104C. Such a laser lift-off process may remove the first carrier substrate 112 in a non-destructive manner, and, therefore, first carrier substrate 112 may be recycled for additional growth processes. An etching process, a chemical-mechanical polishing (CMP) process, or a combination of such processes may be used as desirable to remove any remaining portion of the glass bonding layer 114 on the seed structures 104C.

Figure 8:
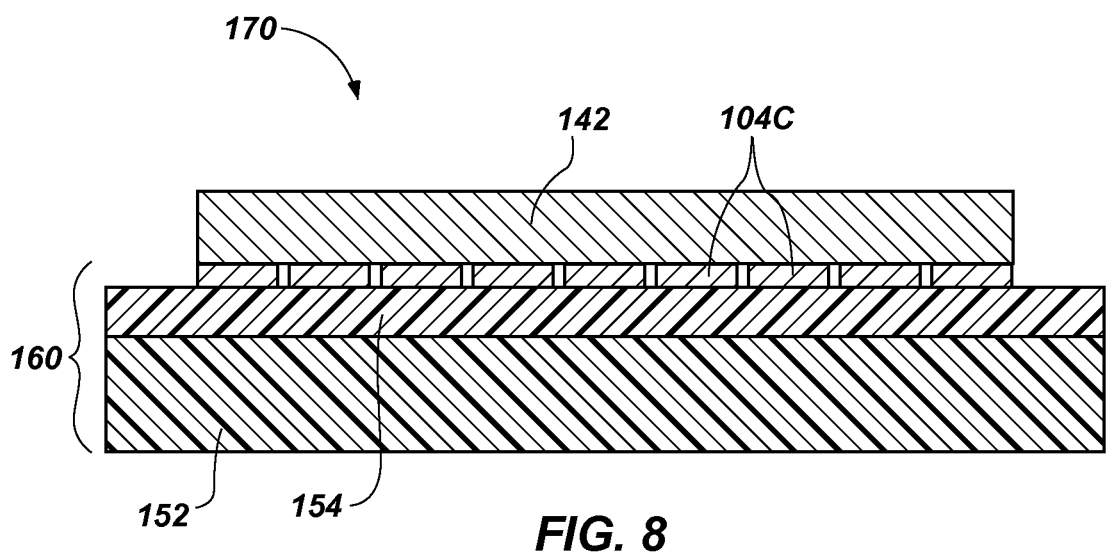
FIG. 8 is a simplified cross-sectional view of another intermediate structure that may be formed by growing additional semiconductor material over the patterned semiconductor material on the intermediate structure of FIG. 7.

Referring to FIG. 8, after removing the first carrier substrate 112 and the glass bonding layer 114 from the seed structures 104C, another layer of semiconductor material 142 may be epitaxially grown over the seed structures 104C as previously discussed in relation to FIG. 5 to form an intermediate structure 170 as shown in FIG. 8.

In the embodiment of FIG. 8, however, the non-glassy bonding layer 154 does not soften or reflow at temperatures at which the epitaxial layer of semiconductor material 142 is grown over the seed structures 104C. The non-glassy bonding layer 154 may not exhibit a glass transition temperature (Tg), or may exhibit a glass transition temperature (Tg) that is greater than a temperature at which the epitaxial layer of semiconductor material 142 is grown over the seed structures 104C. Thus, in the embodiment of FIG. 8, as the intermediate structure 160 (FIG. 7) is heated to the temperature at which the epitaxial layer of semiconductor material 142 is to be grown over the seed structures 104C, the thermal expansion of the second carrier substrate 152, which exhibits a higher coefficient of thermal expansion than the seed structures 104C, may cause the crystal lattices of the seed structures 104C to expand or "stretch" in lateral directions parallel to the plane of the generally planar carrier substrate 152.

As previously mentioned, however, the seed structures 104C initially may be in a state of compression at room temperature. The degree of compressive strain in the seed structures 104C may be increased beyond that commonly found in the prior art due to the thermal treatment utilized to substantially relax the tensile strain in the seed structures 104C at elevated temperature. Since the tensile strain is reduced via relaxation at elevated temperature, when the seed structures 104C are cooled, the greater CTE of the carrier substrate 112 may place the seed structures 104C under an increased degree of compressive strain. Thus, depending upon the ultimate temperature at which the epitaxial layer of semiconductor material 142 is to be grown over the seed structures 104C, the seed structures 104C may remain in a state of compression (although reduced relative to that at room temperature, the seed structures 104C may be relaxed (i.e., the seed structures 104C may not be in a state of compression or tension), or the seed structures 104C may be in a state of tension.

In some embodiments, the material compositions of the seed structures 104C, the carrier substrate 154, and the non-glassy bonding layer 154, as well as the temperature at which the carrier substrate 154 is bonded to the seed structures 104C and the temperature at which the epitaxial layer of semiconductor material 142 is grown over the seed structures 104C (and any other pertinent process parameters) may be selected to cause the seed structures 104C to be in a relaxed state while the epitaxial layer of semiconductor material 142 is grown over the seed structures 104C. In other embodiments, they may be selected to cause the seed structures 104C to be in a state of compression, or in a state of tension, while the epitaxial layer of semiconductor material 142 is grown over the seed structures 104C.

After the epitaxial layer of semiconductor material 142 is grown over the seed structures 104C, upon cool down to room temperature, the epitaxial layer of semiconductor material 142 and the seed structures 104C may be in a state of compression caused by the thermal contraction of the carrier substrate 154, to which they are attached by the non-glassy bonding layer 154, as the carrier substrate 154 will thermally contract at a rate greater than that at which the epitaxial layer of semiconductor material 142 and the seed structures 104C thermally contract due to the higher coefficient of thermal expansion (and thermal contraction) of the carrier substrate 154.

As a result of the crystal lattices of the seed structures 104C and the layer of semiconductor material 142 being placed in a state of compressive strain, the probability that cracks and other defects may nucleate and propagate within the seed structures 104C and the epitaxial layer of semiconductor material 142 may be reduced.

Although embodiments of the present invention have been primarily described herein with reference to semiconductor materials comprising gallium nitride and indium gallium nitride, the present invention is not so limited, and embodiments of the present invention may be used to provide layers of other III-V type semiconductor materials (e.g., GaAs, InP, AlGaN, etc.), layers of II-VI type semiconductor materials, layers of silicon, layers of germanium, layers of silicon carbide (SiC), etc.

While the present invention has been described herein with respect to certain embodiments, those of ordinary skill in the art will recognize and appreciate that it is not so limited. Rather, many additions, deletions, and modifications to the embodiments described herein may be made without departing from the scope of the invention as hereinafter claimed. In addition, features from one embodiment may be combined with features of another embodiment while still being encompassed within the scope of the invention as contemplated by the inventors.

What is claimed is:

1. A semiconductor structure or device comprising:
    a carrier substrate;
    a non-glassy bonding layer deposited upon the carrier substrate;
    a plurality of seed structures bonded to the non-glassy bonding layer through a bonding interface, a mean coefficient of thermal expansion of the carrier substrate greater than a mean coefficient of thermal expansion of the plurality of seed structures; and
    at least one layer of a semiconductor material grown upon a surface of the plurality of seed structures, a thickness of the at least one layer of the semiconductor material greater than two (2) microns, and the mean coefficient of thermal expansion of the carrier substrate greater than a mean coefficient of thermal expansion of the at least one layer of the semiconductor material.

2. The semiconductor structure of claim 1, wherein the non-glassy bonding layer comprises at least one of $SiO_2$, $Si_3N_4$ and $SiO_xN_y$.

3. The semiconductor structure of claim 1, wherein the seed structures of the plurality of seed structures comprise compressively strained gallium nitride.

4. The semiconductor structure of claim 1, wherein each seed structure of the plurality of seed structures has lateral dimensions X and Y of between about five microns (5 μm) and about one millimeter (1 mm).

5. The semiconductor structure of claim 1, wherein each of the plurality of seed structures is spaced from adjacent seed structures by a distance of between about one micron (1 μm) and about one hundred microns (100 μm).

6. The semiconductor structure of claim 1, wherein the thickness of the at least one layer of the semiconductor material is greater than six microns (6 μm).

7. The semiconductor structure of claim 1, wherein the at least one layer of the semiconductor material comprises compressively strained gallium nitride.

8. A semiconductor structure or device comprising:
a carrier substrate;
a non-glassy bonding layer deposited upon the carrier substrate;
a plurality of seed structures bonded to the non-glassy bonding layer through a bonding interface and comprising compressively strained gallium nitride; and
at least one layer of a semiconductor material grown upon a surface of the plurality of seed structures, a thickness of the at least one layer of the semiconductor material greater than two (2) microns.

9. The semiconductor structure of claim 8, wherein the a mean coefficient of thermal expansion of the carrier substrate is greater than a mean coefficient of thermal expansion of the plurality of seed structures and a mean coefficient of thermal expansion of the at least one layer of a semiconductor material.

10. The semiconductor structure of claim 8, wherein the non-glassy bonding layer comprises at least one of $SiO_2$, $Si_3N_4$ and $SiO_xN_y$.

11. The semiconductor structure of claim 8, wherein each seed structure of the plurality of seed structures has lateral dimensions X and Y of between about five microns (5 μm) and about one millimeter (1 mm).

12. The semiconductor structure of claim 8, wherein each of the plurality of seed structures is spaced from adjacent seed structures by a distance of between about one micron (1 μm) and about one hundred microns (100 μm).

13. The semiconductor structure of claim 8, wherein the thickness of the at least one layer of the semiconductor material is greater than six microns (6 μm).

14. The semiconductor structure of claim 8, wherein the at least one layer of the semiconductor material comprises compressively strained gallium nitride.

\* \* \* \* \*